United States Patent [19]

Tanaka

[11] 4,054,804

[45] Oct. 18, 1977

[54] BIPOLAR CHARGING AND DISCHARGING CIRCUIT

[75] Inventor: Yuji Tanaka, Kawasaki, Japan

[73] Assignees: Nippon Tsu Shin Kogyo K.K., Kawasaki, Japan; TIE/Communications, Inc., Stamford, Conn.

[21] Appl. No.: 728,862

[22] Filed: Oct. 1, 1976

[30] Foreign Application Priority Data

Feb. 2, 1976    Japan .................................. 51-10173

[51] Int. Cl.² ........................ H03K 17/56; H03K 5/13
[52] U.S. Cl. .................................. 307/246; 307/229; 307/236; 307/268; 307/294
[58] Field of Search ............... 307/229, 236, 242, 246, 307/262, 268, 293–294; 328/127

[56] References Cited

U.S. PATENT DOCUMENTS

| | | | |
|---|---|---|---|
| 3,444,393 | 5/1969 | Sassler | 307/229 |
| 3,497,723 | 2/1970 | Nelson | 307/268 |
| 3,701,909 | 10/1972 | Holmes et al. | 307/246 |
| 3,838,346 | 9/1974 | Cox | 307/229 |
| 4,002,927 | 1/1977 | Nakamura | 307/246 |

*Primary Examiner*—Stanley D. Miller, Jr.
*Attorney, Agent, or Firm*—Kenyon & Kenyon

[57] ABSTRACT

A timing circuit is disclosed in which the charging time constant in response to positive or negative pulses can be independently controlled. The discharging time constant in response to the removal of all signal pulses from the input of the circuit can be fixed differently from the charging time constants.

3 Claims, 3 Drawing Figures

BIPOLAR CHARGING AND DISCHARGING CIRCUIT

BACKGROUND OF THE INVENTION

1. Field of the Invention

The present invention relates to a timing circuit, and in particular to one that is an improvement upon a timing circuit connected to a comparator circuit output.

2. Description of the Prior Art

In prior art timing circuits connected to the output of an operational amplifier comparator circuit, as shown in FIG. 1 of the drawings, a standard circuit has been used wherein a resistor RL and a capacitor CO are connected to the output of a comparator amplifier Y1 and determine the output time constant of the amplifier Y1 appearing at output terminal 3. The potential of terminals 1 and 1' is a reference or ground potential. Supply sources to Y1 are V+ and V−. Resistor $R_f$ is a feedback resistor, and RO is an output load resistor. A potential corresponding to a signal level is applied at terminal 2 and is compared to the reference potential and inverted by amplifier Y1.

When a voltage higher than the reference potential is applied at terminal 2, where RL << RO and the output resistance of Y1 is sufficiently small, the output voltage at the output of Y1 swings sharply negative and the voltage at terminal 3 changes from the reference potential to V− potential with the time constant of $T_O = R_L{}^{19} C_O$. Next, when the applied voltage at terminal 2 is removed, the output of Y1 returns sharply to the reference voltage and that of terminal 3 returns to the reference potential with the same time constant, $T_O$. Conversely, when a voltage lower than the reference potential is applied at terminal 2, the output potential of Y1 swings sharply positive and that of terminal 3 shifts to potential V+ at the same time constant, $T_O$. Then, when the input at terminal 2 is removed, the voltage at terminal 3 returns to the reference voltage at the same time constant, $T_O$.

Recently there has developed a need for timing circuits connected to the output of a comparator amplifier which can respond with a short "attack" time constant to the application of a voltage pulse of either polarity to the comparator input and which can respond with a long "release" time constant to the removal of said voltage pulse from the comparator input, (that is, the return of the output to reference potential), and which has different attack time constants corresponding to the polarity of the comparator output with respect to the reference voltage. Prior art timing circuits have a disadvantage in only being able to respond with a single time constant, whether the pulse is being applied or removed, and without regard for the polarity of the output potential of the comparator as described above.

A primary object of this invention is to provide a timing circuit which responds with different time constants depending on whether a pulse is being applied or being removed at the input of a comparator amplifier.

A further object of this invention is to provide a timing circuit which can respond with different time constants to pulses of different polarity applied at the input of a comparator amplifier.

SUMMARY OF THE INVENTION

The timing circuit of the invention is a capacitor charging and discharging circuit that comprises (a) a reference potential terminal, (b) an input terminal to which may be applied three input signal voltages; the same voltage as the said reference potential; a higher potential than the reference potential; and a lower voltage than the said reference potential, (c) an output terminal at which there are output potentials corresponding to the inputs to the said timing circuit, (d) a capacitor for charging and discharging connected between the output terminal and the reference potential terminal, (e) a discharging resistor connected in parallel to the capacitor, (f) a primary charging resistance connected between the said input terminal and the said output terminal, (g) a secondary charging resistance connected in parallel with the primary charging resistance, (h) a primary switching means interposed between the primary charging resistance and the said input terminal and that closes only when the input potential to the input terminal is a potential higher than the reference potential, and (i) a secondary switching means interposed between the secondary charging resistance and the input terminal and that closes only when the input potential to the input terminal is a potential lower than the reference potential, wherein the charging time is different when the input potential is higher than the reference potential than when it is lower than the reference potential.

This invention, as well as its objects and features, will be better understood by reference to the following detailed description of the preferred embodiment of this invention taken in conjunction with the accompanying drawings described briefly below.

The charging and discharging circuit includes (a) a PNP transistor Q101 that is turned on when the potential of input terminal T1 (the output of amplifier Y1) becomes higher than the reference potential, (b) an NPN transistor Q102 that is turned on when the potential of input terminal T1 becomes lower than the reference potential (c) RL' and RL" are collector load resistors of each transistor Q101 and Q102 and are charging resistors, (d) base bias resistors R101 and R103 of transistor Q101, (e) base bias resistors R102 and R104 of transistor Q102, (f) timing capacitor C100, and (g) output load resistance R100. Also, D101 and D103 are base-emitter reverse voltage blocking diodes respectively of Q101 and Q102, and D102 and D104 are collector reverse current blocking diodes.

Figure 1:
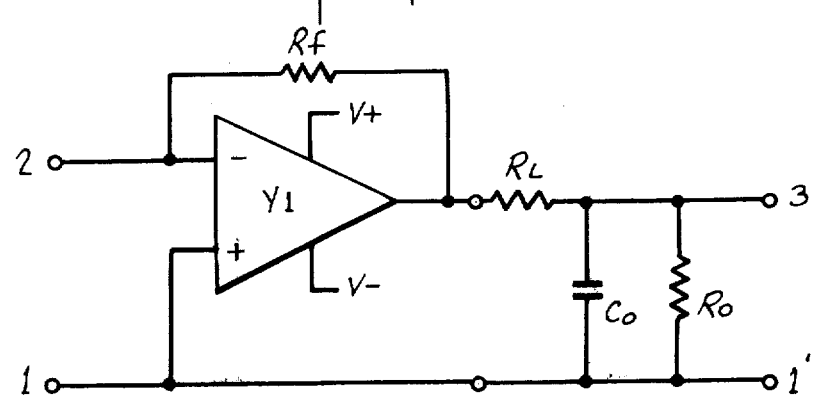
FIG. 1 is a prior art circuit previously discussed in reference to the prior art relevant to the present invention.
Figure 2:
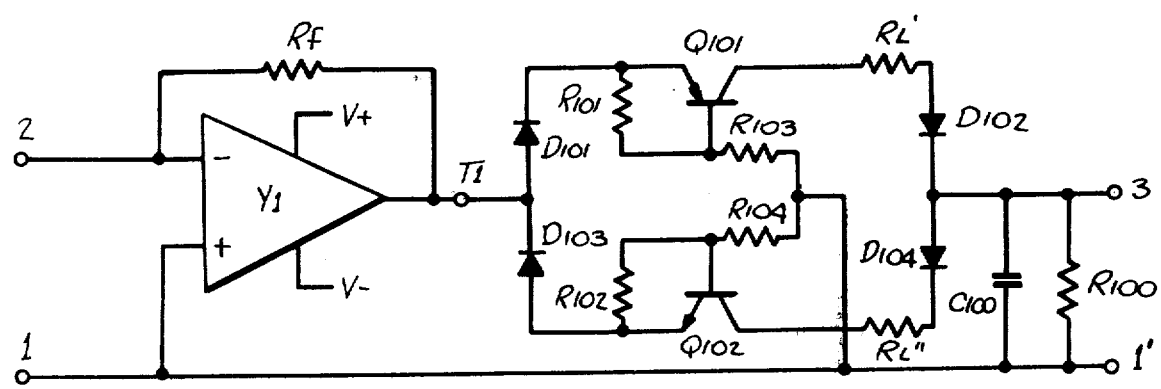
FIG. 2 is a circuit diagram showing the present invention, which uses the same reference codes as in FIG. 1 for those parts that are the same. Terminal T1 is the input terminal of the present timing circuit and is connected to the output terminal of amplifier Y1.
Figure 3:
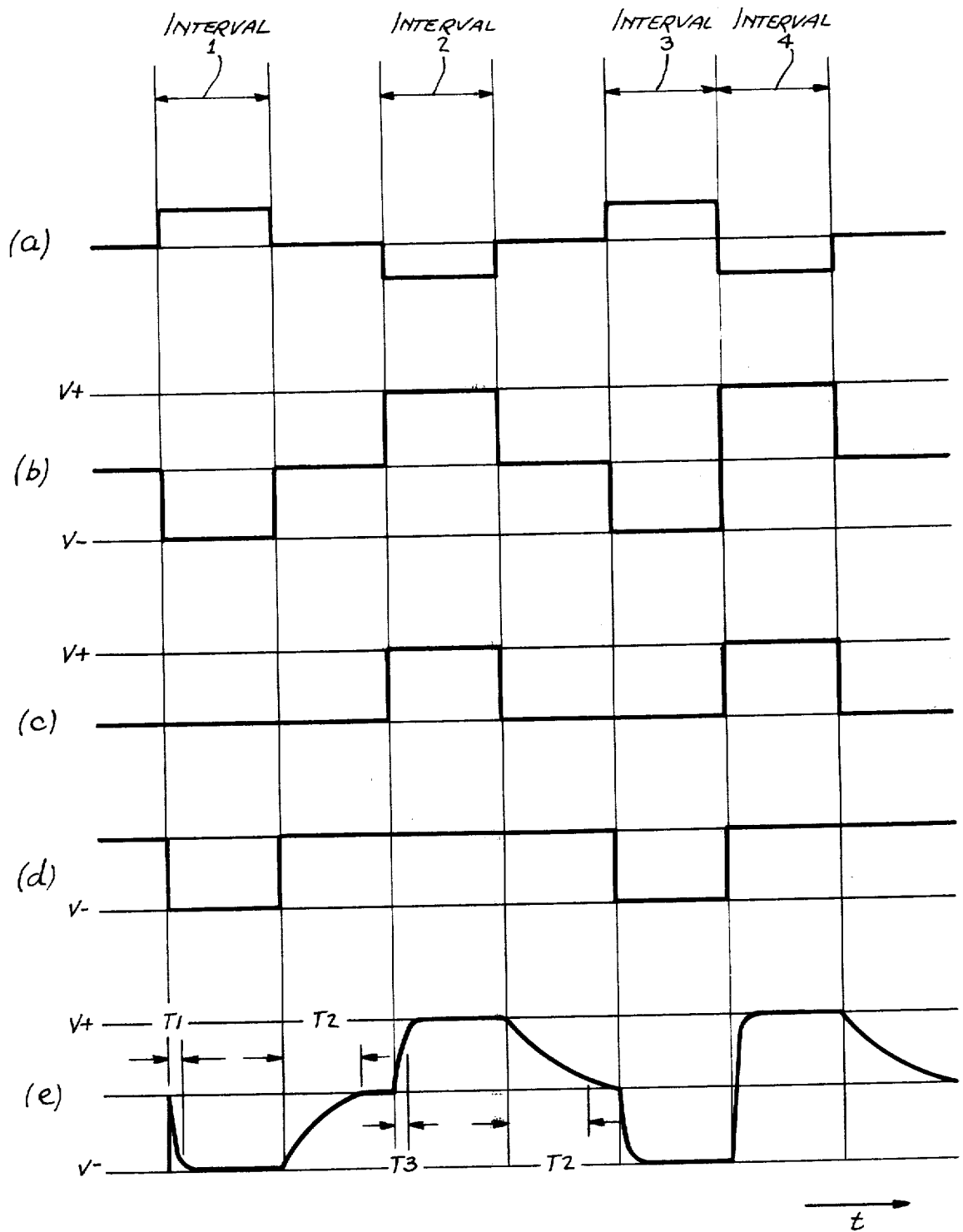

FIG. 3 shows the output waveforms that correspond to the potentials at each point in the circuit of FIG. 2, wherein (a) is the input signal potential at terminal 2, (b) is the output potential of amplifier Y1, (c) is the collector potential of transistor Q101, (d) is the collector potential of transistor Q102, and (e) is the output potential at terminal 3.

DESCRIPTION OF THE INVENTION

The invention will be described by explaining the operation of the circuit shown in FIG. 2 as different input signals are applied to it. The explanation will refer to voltage waveforms shown in FIG. 3 appearing at various terminal points in the circuit.

It will be assumed, for the purpose of explaining the operation of the circuit of FIG. 2, that the waveform indicated as (a) of FIG. 3 is applied to terminal 2. Positive pulses are shown at intervals 1 and 3; negative pulses are shown at intervals 2 and 4. Positive and negative potentials are measured with respect to the reference potential of terminals 1 and 1'.

When terminal 2 is at zero or reference potential, the output terminal of amplifier Y1 is at reference potential, and consequently transistors Q101 and Q102 are both in the off state and both collectors and terminal 3 are all at reference potential. When the positive voltage pulse shown as interval 1 of waveform (a) is applied via terminal 2 to comparator amplifier Y1, an inverted output pulse appears at output terminal T1 of amplifier Y1 with a potential V− as shown in waveform (b) of FIG. 3. As a result a base current flows from reference potential terminals 1 and 1' via resistor R104, the base-emitter of transistor Q102 and diode D103. Transistor Q102 is turned on and the collector output potential of transistor Q102 drops to approximately a V− voltage (neglecting the junction drops) as shown in waveform (d) of FIG. 3. Capacitor C100 which had been at the reference potential now charges toward V− volts with the time constant $T_1 = C100 \cdot RL''$ via diode D104, resistor RL'', the collector-emitter of transistor Q102, and diode D103, and after the time T1 the output signal appearing at terminal 3 becomes V− volts as shown in waveform (e) of FIG. 3.

When a short negative going attack time constant is required in response to a negative going output from amplifier Y1, RL'' should be set accordingly to a suitably low resistance.

As shown in waveform (a) of FIG. 3, interval 1 is followed by a removal of the input pulse. The ouput terminal T1 of amplifier Y1 returns to the reference potential, transistor Q102 turns off, and capacitor C100 discharges to the reference potential with the time constant $T_2 = C100 \cdot R100$ via resistor R100. When a long release time constant is required in response to the removal of the output potential of amplifier Y1, resistor R100 is selected to be a suitably high resistance. After the input signal of terminal 2 ceases, it is thus possible to maintain an output signal at terminal 3 by means of a long time constant as capacitor C100 discharges from V− volts toward the reference potential as shown by waveform (e) in FIG. 3.

Next, it will be assumed that in interval 2, shown in waveform (a) of FIG. 3, a negative voltage pulse (negative with respect to the reference potential) is impressed at terminal 2. Amplifier Y1 inverts the pulse, and the output terminal of amplifier Y1 switches to V+ potential as shown by waveform (b) in FIG. 3. Consequently a base current flows to reference potential terminals 1 and 1' from the output terminal T1 of amplifier Y1 via diode D101, the emitter-base of transistor Q101, and resistor R103. Transistor Q101 is turned on, and the collector output potential of transistor Q101 becomes V+ volts as shown in waveform (c) of FIG. 3. At this time, capacitor C100 that had been at the reference potential starts charging at the time constant $T_3 = C100 \cdot RL'$ from the output terminal of amplifier Y1 via diode D101, the emitter-collector of transistor Q101, resistor RL' and diode D102. The output of terminal 3 approaches V+ volts as shown in waveform (e) of FIG. 3. When a short positive going attack time constant is required, resistor RL' is selected to be of an appropriately low resistance, in the same manner that RL'' was selected to control the negative going attack time constant of the output of amplifier Y1 in response to the application of a positive input pulse to terminal 2, described above. When it is required that the time constants be equal for both attack times, in response to both positive and negative pulses, RL' should equal RL''.

After the negative pulse of interval 2 is removed from the input, in the same way as when the positive pulse was removed, the output terminal of amplifier Y1 returns to the reference potential, transistor Q101 shuts off, and capacitor C100 discharges toward the reference potential with the time constant $T_2 = C100 \cdot R100$ via resistor R100. Since this time constant $T_2$ is the same as following the removal of the positive potential input, the output at terminal 3 continues to be at a non-zero voltage for a fixed time after the input signal of terminal 2 is removed, decreasing toward zero from the positive potential V+, as shown in waveform (e) of FIG. 3.

Next it is assumed for intervals 3 and 4 shown in waveform (a) of FIG. 3 that a positive pulse at terminal 2 is immediately followed by a negative pulse. Capacitor C100 is charged to V− volts in response to the positive pulse of interval 3 with time constant of $T_1 = C100 \cdot RL'$ as described above. In response to the pulse of interval 4, transistor Q102 turns off and transistor Q101 is immediately turned on, so that capacitor C100 recharges at the short time constant rate of $T_3 = C100 \cdot RL'$, and the output of terminal 3 swings from V− volts to V+ volts rapidly as shown in interval 4 of waveform (e) in FIG. 3. The case of a negative pulse immediately followed by a positive pulse would cause capacitor C100 to recharge from V+ volts to V− volts at the rate $T_1 = C100 \cdot RL''$, the reverse of the above case.

Consequently, when the potential of the output terminal of amplifier Y1 rises from the reference potential to a positive potential, transistor Q102 does not turn on, and when it falls to a negative potential transistor Q101 does not turn on, so that independent attack time constants can be obtained that correspond to the pulse polarities of the output of comparator amplifier Y1. Since transistors Q101 and Q102 are not turned on when the comparator amplifier output returns to reference potential, a long release time constant can be obtained by the selection of a high resistance output load resistor R100.

In accordance with the present invention as described above, by selecting attack charging resistors RL' and RL'' and release discharging resistor R100, it is possible to independently set the attack time constants in response to positive or negative input pulses and also the release time constant upon cessation of the input pulses of a single capacitor timing circuit as desired.

What is claimed is:

1. A timing circuit which has different charging time constants in response to positive and negative input signal pulses and a different discharging time constant in response to the removal of an input signal, said circuit comprising,
   a reference potential terminal,
   an input terminal for receiving said input positive and negative signal pulses, said pulses being of positive or negative potential with respect to the potential of said reference potential terminal,
   an output terminal,
   a capacitor connected between said output terminal and the reference potential terminal,
   a discharge resistor connected in parallel with said capacitor, a first series connection comprising a first charging resistor connected in series with a first switching means, said series connection being interposed between said input terminal and said output terminal, said first switching means being in a conducting state only when the input potential to said input terminal is at a level higher than said reference potential, and a second series connection comprising a second charging resistor connected in series with a second switching means, said series connection being interposed in parallel with said first series connection between the input terminal and the output terminal, said second switching means being in a conducting state only when the input potential to said input terminal is at a level lower than said reference potential.

2. The charging and discharging circuit of claim 1 wherein said first and second switching devices are transistor switching circuits.

3. The charging and discharging circuit of claim 2 wherein, said first switching means is a PNP transistor the emitter of which is connected to said input terminal, the collector of which is connected to said first charging resistor, and the base of which is connected to said reference terminal, and said second switching means is an NPN transistor, the emitter of which is connected to said input terminal, the collector of which is connected to said second charging resistor, and the base of which is connected to said reference potential terminal.

* * * * *